United States Patent [19]

Göettler et al.

[11] 4,164,040
[45] Aug. 7, 1979

[54] CCD STORAGE MODULE

[75] Inventors: Ernst Göettler, Munich; Otto Grüeter, Krailling, both of Fed. Rep. of Germany

[73] Assignee: Siemens Aktiengesellschaft, Berlin & Munich, Fed. Rep. of Germany

[21] Appl. No.: 874,206

[22] Filed: Feb. 1, 1978

[30] Foreign Application Priority Data

Feb. 4, 1977 [DE] Fed. Rep. of Germany ....... 2704718

[51] Int. Cl.² ............................................ G11C 11/40
[52] U.S. Cl. .................................... 365/183; 365/45; 357/24; 307/238
[58] Field of Search .................... 365/45, 183; 357/24; 307/238, 279

[56] References Cited

U.S. PATENT DOCUMENTS

| 3,958,210 | 5/1976 | Levine | 365/183 |
| 3,967,254 | 6/1976 | Kosonocky | 365/183 |

*Primary Examiner*—Terrell W. Fears
*Attorney, Agent, or Firm*—Hill, Van Santen, Steadman, Chiara & Simpson

[57] ABSTRACT

A CCD storage module has storage positions which are arranged in cascade and which are produced by electrodes arranged in insulated fashion above a semiconductor substrate. In respect of each storage position, an item of information incoming as a n-digit binary number is stored in that a quantity of charge consisting of i unit charges is stored in respect of each storage position, where i corresponds to the value of the binary number of the information. A decoder circuit is provided for the input of the quantity of charge to the first storage position. The decoder circuit consists of n input circuits and each input circuit is assigned one bit position of the information composed of n bits and produces a charge corresponding to the digit value of that position. The outputs of the input circuits are linked with the aid of an electrode which is common to all of the input circuits to form the next storage position of a storage field and between the common electrode and the outputs of the input circuits there is, in each case, a surrender electrode which determines whether or not the charge produced by the input circuit reaches the common electrode.

5 Claims, 4 Drawing Figures

CCD STORAGE MODULE

BACKGROUND OF THE INVENTION

1. Field of the Invention

The present invention relates to a CCD storage module having storage positions which are arranged in cascade and which are formed with the aid of electrodes arranged in insulated fashion above a semiconductor substrate, and more particularly to such an arrangement wherein, in respect of each storage position, an item of information incoming as a n-digit binary number is stored in that a quantity of charge composed of i unit charges is stored in respect of each storage position, where i corresponds to the value of the binary number of the information.

2. Description of the Prior Art

Charge coupled device stores (CCD stores) or charge shift arrangements are well known in the art. In this respect, one may refer to the publications "Electronics", June 21, 1971, pages 58ff and to the "Bell System Technical Journal", Vol. 940, Edition 4/1970, pages 587–593. These arrangements fundamentally consist of a semiconductor substrate, an electrically insulating layer carried on the substrate, and electrodes arranged on the insulating layer. The electrodes are electrically isolated from one another. The principle of the CCD store is based on connecting suitably selected voltages to the electrodes in order to achieve favorable potential conditions at the boundary surface between the insulating layer and the semiconductor substrate, where minority charge carriers can be stored. At a suitable instant time, a special write-in device writes minority charge carriers into these potential wells or blocks the inflow of minority charge carriers to the potential wells, as governed by the particular item of information to be written in. Therefore, charge shift arrangements of this kind are particularly suitable for shift registers.

It is also well known in the art to employ charge shift arrangements as memories. For this purpose, at the beginning of the charge shift arrangement constructed as a shift register, which in the following will be referred to as a "storage field", there is provided an input stage, at the output of the storage field there is provided an output stage, and between the output stage and the input stage there is provided a regenerator stage. This type of construction can be referred to as a storage loop. As the individual storage positions of a storage loop of this type can store the information only for a specific length of time, the stored information continuously circulates. In so doing, the information is also conducted across the regenerator stage and thus regenerated during each cycle.

A goal in the development of CCD stores is to achieve the greatest possible storage density on a semiconductor substrate. Several methods of achieving this goal have already been proposed.

A first method of achieving the greatest possible storage density is a reduction in structure. This method is the primary object of the technological development.

A second method resides in improved circuitry measures. The E/B principle which is described, for example, in the "IEEE Journal of Solid State Circuits", February 1976, Vol. SC-11, No. 1, Section C, pages 8–9, and which is applied to a storage field arranged in accordance with the SPS principle is along these lines.

A further method is likewise described in the above-mentioned publication, in which it is stated that it should also be possible to store more than one bit in respect of each storage position of a CCD store. This principle is referred to as multilevel storage (MLS). With this principle, the property of CCD arrangements of being able to process analog signals is employed. In order to be able to store, for example, a four-digit binary number, 16 different charge levels are required. In accordance with the binary signal present in parallel on, for example, four lines (in accordance with the four bits of the binary number), numbers 0, 1, 2 ... 14 or 15 times a suitably selected charge unit, which in the following will be referred to as a "unit charge", is input into the CCD storage field. This necessitates a decoder circuit of appropriate construction. An evaluator circuit at the output of the CCD storage field must establish the size of the incoming quantity of charge and reconvert this 1-out-of-16 signal into the four-bit signal. The information is then returned, in this form, to the input of the storage field, thus to the decoder circuit.

Therefore, if a n-digit binary number is to be stored beneath a storage position of a CCD storage module, it is necessary to transmit a quantity of charge composed of i unit charges to the storage position, where i is the value of the binary number of the information, and $i \leq (2^n - 1)$.

SUMMARY OF THE INVENTION

The object of the present invention is to provide an arrangement with the aid of which, in a CCD storage module operating in accordance with the MLS principle, the quantity of of charge corresponding to a binary number can be produced and transmitted to the first storage position of the storage field.

This object is realized in that a decoder circuit is provided for the input of the quantity of charge to the first storage position, that the decoder circuit consists of n input circuits, that each input circuit is assigned one bit position of the information composed of n bits and produces a charge corresponding to the digit value of this bit position, that the outputs of the input circuits are linked with the aid of an electrode common to all of the input circuits to form the next storage position of a storage field, and that between the common electrode and the outputs of the input circuits there is, in each case, a surrender electrode which establishes whether or not the quantity of charge produced by the input circuit has reached the common electrode.

An input circuit can consist of a line diffused into the semiconductor substrate, of a first electrode arranged adjacent to the line, and a second electrode which is arranged adjacent to the first electrode and is likewise adjacent the surrender electrode. With the aid of the diffused line in the semiconductor substrate, the charge carriers are made available for the production of the quantity of charge to be input into the arrangement. The first electrode is connected to a first fixed voltage which facilitates the transition of the charge carriers from the diffused line to the second electrode. The second electrode is connected to a second fixed voltage. The quantity of charge to be supplied to the first storage position can be influenced by the difference between the second and first voltages.

It is advantageous to select the second and first voltages for all of the input circuits which are assigned to a cascade of storage positions to be identical. Then, the quantity of charge corresponding to the digit value of a bit position of the binary number can be produced by appropriately selecting the size of the electrically effective surface of the second electrodes. In this case the ratio of the surfaces of the second electrodes to one another can correspond to that of the digit values of the bit positions of the binary number.

It is further advantageous, in addition to the quantity of charge corresponding to the information, to supply a basic charge of, for example, the magnitude of the unit charge to the first storage position. This basic charge serves to avoid transmission losses originating from the surface states on the semiconductor substrate. In this case $2^n$ charge levels are passed through the store, the basic charge and in dependence upon the information, up to $(2^n-1)$ further charge levels.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
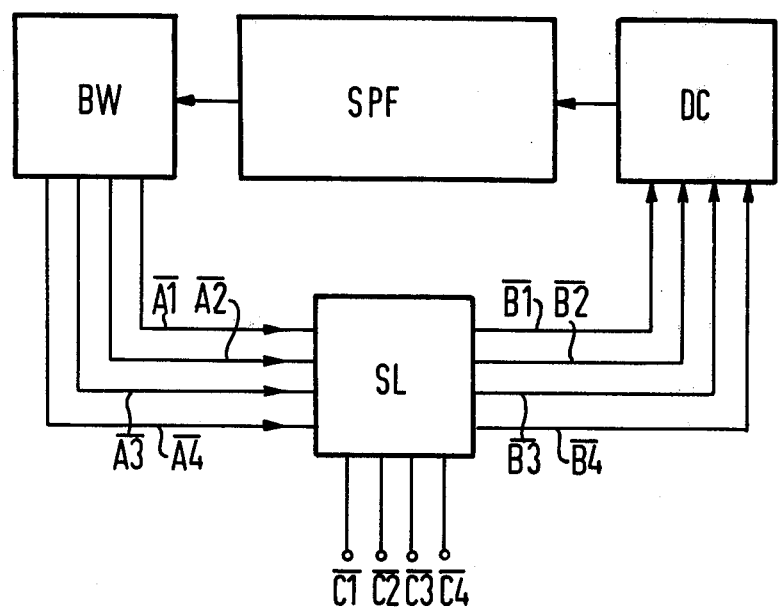
FIG. 1 is a block circuit diagram of a CCD store having MLS operation.

FIG. 1 is a block circuit diagram of a CCD store operating in accordance with the MLS principle. A CCD store of this type consists of a storage field SPF which can be constructed in a well known manner, for example as described in the "IEEE Journal of Solid State Circuits", February 1976.

In order to be able to input the information into the storage field SPF, and in fact in accordance with MLS operation, a decoder circuit is required, and such circuit is here referenced DC. The decoder circuit DC is supplied with the information to be stored—in the exemplary embodiment via, for example, four lines B1 to B4. Here, it has been assumed that the binary number which is to be stored consists of four bits (n=4). In the decoder circuit DC, the binary number which has been supplied on the lines B1 to B4 is transformed into a multiple i of the unit charge corresponding to the binary number, and is fed to the storage field SPF. The design of the decoder circuit DC is described below.

The charge passes through the storage field SPF, and at the output of the storage field passes to an evaluator circuit BW. The evaluator circuit BW reconverts the quantity of charge eminating from the storage field SPF into the binary number, and emits the individual positions of this binary number at the output on four lines $\overline{A1}$ to $\overline{A4}$. From these lines, the binary number passes to a switch arrangement SL. The switch arrangement SL can either return the binary number to the decoder circuit DC, or forward the binary number for other processing by way of output lines $\overline{C1}$ to $\overline{C4}$. The lines $\overline{C1}$ to $\overline{C4}$ are also used to input the items of information into the store, and, in fact, by way of the switch arrangement SL which then feeds the information to the decoder circuit DC.

On the drawings, the lines are referenced with upper case letters B, $\overline{A}$, $\overline{C}$ and the signals on these lines are referenced with corresponding lower case letters b, $\overline{a}$, $\overline{c}$.

In the following, only the construction of the decoder circuit DC will be described. The other units, the storage field SPF, the evaluator circuit BW and the switch arrangement SL, do not form the subject matter of the present invention. The construction of the evaluator circuit BW and of the switch arrangement SL can be obtained from the copending, concurrently filed application Ser. No. 874,200.

A decoder circuit DC comprises input circuits, the number of which corresponds to the number n of the bit positions of the binary number which is to be stored. The quantity of charge emitted by the decoder circuit DC is fed to the first electrode of the storage field SPF. The first electrode can simultaneously constitute the first storage position of the storage field.

Figure 2:
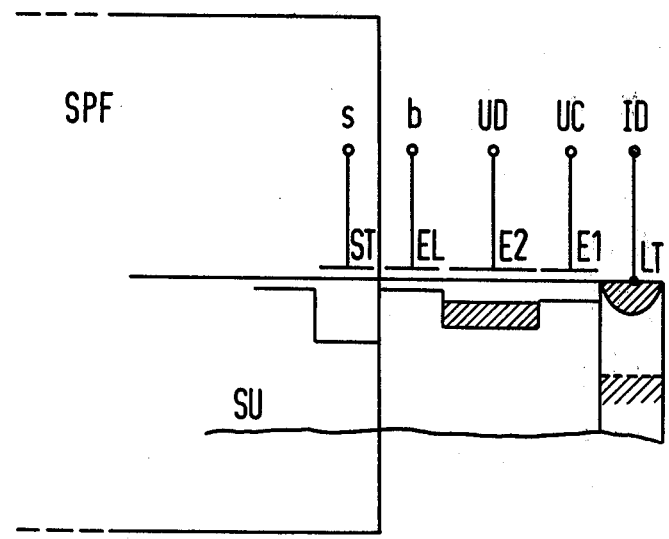
FIG. 2 illustrates an input circuit connected to the input of a CCD storage field.

The construction of an input circuit is illustrated in FIG. 2. With the aid of a line LT diffused into the semiconductor substrate SU, the minority charge carriers, in the exemplary embodiment electrons, are fed to the input circuit. For this purpose, the line LT is connected to a current source ID. The line LT is adjoined by a first electrode E1 which is connected to a fixed voltage UC. The first electrode E1 is adjoined by a second electrode E2 which is connected to a second fixed voltage UD. In the exemplary embodiment illustrated on the drawings, the second voltage UD is more positive than the first voltage UC. The difference between the voltage UD and UC determines the quantity of charge which is fed to the first storage position ST. Whether this quantity of charge reaches the first storage position or not is determined with the aid of a surrender electrode EL which is arranged adjacent to the second electrode EL and, signal b is connected to the surrender electrode EL and, in fact, in dependence upon whether the bit position to which the input circuit is assigned is "0" or "1". The surrender electrode EL is adjoined by the first storage position ST which is supplied with a quantity of charge which has been produced in the input circuit. A pulse train s is connected to the storage position ST. In the exemplary embodiment illustrated in FIG. 1, the first storage position ST is formed by the first storage electrode of a storage field SPF.

Beneath the electrodes and the line, the potential conditions are entered in a curve. Here, the shaded area in a potential well beneath the electrode indicates the quantity of charge contained in the potential well. The quantity of charge present in the potential well beneath the second electrode E2 is transported to the potential well beneath the first storage position ST by the connection of the pulse train b to the surrender electrode EL. For this purpose, the potential carried by the electrode EL is reduced in such a manner to enable the quantity of charge to flow from the electrode E2 to the storage position ST.

A number of input circuits corresponding to the number of bit positions in a binary number are linked in order to produce the quantity of charge corresponding to the binary number. If, for example, the number of bit positions is four, it must be possible to produce 16 different charge levels with the four input circuits. This is effected with the aid of the parallel connection of input circuits, the number of which corresponds to the number of positions in the binary number. The manner in which these input circuits are connected in parallel is illustrated in FIG. 3.

Figure 3:
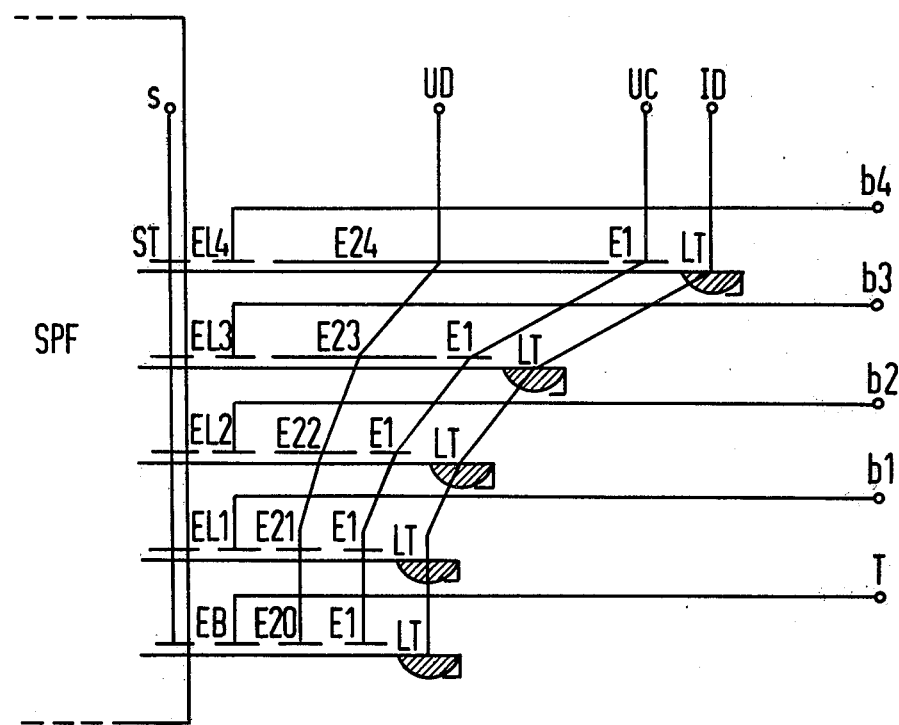
FIG. 3 illustrates the linking of a plurality of input circuits for MLS operation.

In FIG. 3 four input circuits are connected in parallel. Each input circuit is constructed as illustrated in FIG. 2. Therefore, each input circuit possesses a diffused line LT, a first electrode E1, a second electrode E21 for example and a surrender electrode EL1 (where 1=1...4). The lines LT are connected to the same current source ID. The electrodes E1 are all connected to the fixed voltage UC and the electrodes E21-E24 are all connected to the fixed voltage UD. In order to be able to produce the various quantities of charge corresponding to the digit value of the bit position, the electrically active surfaces of the second electrodes E21-E24 are contrived accordingly. With a binary number comprising four bit positions, the first bit position has the digit value 1, the second bit position has the digit value 2, the third bit position has the digit value 4, and the fourth bit position has the digit value 8. The electrically active surfaces of the electrode E21-E24 are also selected in accordance with the digit values of the bit positions of the binary number relative to one another. That is to say that the electrically active surface of the second electrode E22 is twice the electrically active surface of the electrode E21. The electrically active surface of the electrode E23 is, in turn, twice the electrically active surface of the electrode E22, and the electrically active surface of the electrode E24 is twice the electrically active surface of the electrode E23. As a result of this dimensioning of the second electrodes E21-E24, it is therefore possible to produce a charge corresponding to the digit value of the bit position without the need to connect different voltages to the electrodes E21. The surrender electrodes EL1-EL4 establish whether or not the charge corresponding to the digit value of a binary position is actually fed to the first storage position ST. If a bit position of a binary number is "0", the quantity of charge corresponding to the value of this bit position is not forwarded. If the bit position is "1", the quantity of charge corresponding to the value of this bit position is forwarded to the first storage position. FIG. 2 illustrates how this is effected. This action takes place by conducting the pulse train b1 to the surrender electrode EL1 when the bit position is "1" and by not connecting the pulse train b1 when the bit position is "0". FIG. 3 merely indicates these conditions and, in effect, by virtue of the fact that the surrender electrodes EL1-EL4 are supplied with signals b1 to b4 which corresponds to the signal b in FIG. 2. In addition to the surrender electrodes EL1-EL4, there is a common electrode ST which extends over all of the input circuits. This common electrode ST can be the first storage electrode of a storage field SPF.

It is advantageous to supply the first storage position with a basic charge in addition to the charge corresponding to a binary number in order to avoid transmission losses originating from the surface states on the semiconductor substrate. This can be effected with an input circuit corresponding to the input circuit in FIG. 2 and in which the only difference with respect to the input circuits assigned to the bit positions of the binary number is that no surrender electrode EL is provided, but the second electrode E20 is adjoined by an electrode EB to which a timing signal T is always connected. The basic charge is always supplied to the first storage position irrespectively of the value possessed by the binary number which is to be input. The size of the surface of the electrode E20 can, for example, be equal to the size of the electrode E21.

Figure 4:
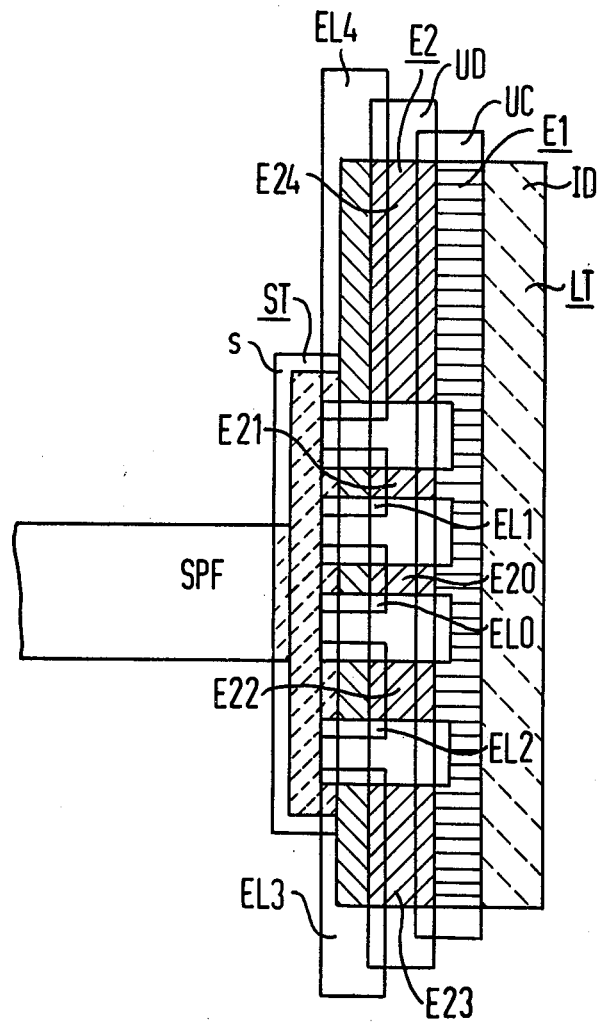
FIG. 4 illustrates a lay-out of the input circuits which are illustrated in FIG. 3.

FIG. 4 illustrates a lay-out of a coder circuit which, in accordance with FIG. 3, consists of five input circuits. Those zones which are electrically active have been shaded. First of all there is a zone illustrated for the line LT which is diffused into the semiconductor substrate and which is connected to a current source ID. The line LT is common to all of the input circuits. The line LT is adjoined by the first electrode E1. The electrically active surface of the electrode E1 directly adjoins the electrically active surface of the line LT. The voltage UC is connected to the electrode E1. On the other hand, the electrically active surface of the electrode E2 directly adjoins the electrically active surface of the electrode E1. The electrically active surface of the electrode E2 is not, however, common to all of the input circuits, but in fact the electrically active surface is divided into sub-surfaces. The size of these sub-surfaces is in proportion to the digit values of the binary positions of the binary number which is to be input. The sub-surfaces are referenced as in FIG. 3. The sub-surface E24 is the largest sub-surface and corresponds to the digit value 8 of a binary number, the sub-surface E23 corresponds to the digit value 4 of the binary number, the sub-surface E22 corresponds to the digit value 2, and the sub-surface E21 corresponds to the digit value 1 of the binary number. A sub-surface E20 is additionally provided for the input of the basic charge in order to compensate losses.

The electrode E2, which as shown above constitutes the electrodes or sub-surfaces E20-E24, is adjoined by the surrender electrodes EL1 which partially overlap the electrode E2. The electrically active surfaces are again, however, adjacent to the electrically active surfaces of the electrode E2. The surrender electrodes EL1 are again referenced in accordance with the surrender electrodes EL1 in FIG. 3, e.g. EL1-EL4.

The surrender electrode EL1 are adjoined by the common electrode ST which serves to combine the individual charges supplied by the individual input circuits. The common electrode ST can, for example, constitute the electrode for the first storage position ST of the storage field SPF illustrated in FIG. 2. The electrode ST is supplied with the timing signal s. The electrically active surface of this common electrode ST adjoins the electrically active surfaces of the surrender electrodes EL1.

As can be gathered from FIG. 4, with the aid of the common electrode ST, the quantity of charge corresponding to a binary number is assembled and fed to the storage field SPF. The pulse trains b1 across the surrender electrodes EL1 determine whether or not a charge corresponding to a bit position of the binary number reaches the common electrode ST.

The technological construction of the arrangement illustrated in FIG. 4 can be achieved in a simple fashion. The double silicon technique can be used, for example, for this purpose. This technique is described, for example, by Carlo H. Sequin and Michael F. Tompsett in their book *"Charge Transfer Devices"*, published by Academic Press, New York, San Francisco, London, 1975, page 19ff.

Although the invention has been described by reference to particularly illustrative embodiments thereof, many changes and modifications of the invention may become apparent to those skilled in the art without departing from the spirit and scope thereof. We therefore intend to include within the patent warranted hereon all such changes and modifications as may reasonably and properly be included within the scope of our contribution to the art.

We claim:

1. In a charge coupled device storage module of the type having storage positions which are arranged in cascade and which are produced by electrodes arranged in insulated fashion above a semiconductor substrate, and wherein, in respect of each storage position, an item of information incoming as a n-digit binary number is stored in that a quantity of charge consisting of i unit charges is stored in respect of each storage position, where i corresponds to the value of the binary number of the information, the improvement therein comprising:
 a decoder connected to said module and comprising n input circuits;
 each of said input circuits being assigned one bit position of the information composed of n bits and operable to produce a charge corresponding to the digit value of the respective position;
 each of said input circuits including an output;
 an electrode common to all of said outputs of said inputs to form the next storage position of a storage field; and
 a plurality of surrender electrodes, each of said surrender electrodes arranged between a respective output of said input circuits and said common electrode for receiving a respective potential to determine whether or not charge produced by the respective input circuits reaches said common electrode.

2. The improved charge coupled device storage module of claim 1, wherein each input circuit comprises a line common to all input circuits and diffused into said semiconductor substrate, a first electrode arranged adjacent said diffused line and connected to a first fixed potential, a second electrode arranged adjacent said first electrode and adjacent said surrender electrode and connected to a second fixed potential, where the quantity of charge to be supplied to the common electrode is influenced by the difference between said first and second potentials.

3. The improved charge coupled device storage module of claim 2, wherein the charge corresponding to the digit value of a bit position is determined by the size of the electrically active surface of said second electrode, the surface of said second electrode being proportional to the digit values of the bit positions of the binary number.

4. The improved charge coupled device storage module of claim 2, wherein said first and second electrodes of said input circuits are commonly supplied with said first and second potentials, respectively.

5. The improved charge coupled device storage module of claim 1, and further comprising a further input circuit operable to input a basic charge into said cascade of storage positions independently of the information connected to said input circuits of said decoder circuit.

* * * * *